(12) United States Patent
Kawai et al.

(10) Patent No.: US 8,294,337 B2
(45) Date of Patent: Oct. 23, 2012

(54) FLEXURAL VIBRATION PIECE, FLEXURAL VIBRATOR, AND ELECTRONIC DEVICE

(75) Inventors: Hiroki Kawai, Chino (JP); Makoto Furuhata, Matsumoto (JP); Akinori Yamada, Ina (JP); Yuji Hamayama, Tokai (JP)

(73) Assignee: Seiko Epson Corporation (JP)

( * ) Notice: Subject to any disclaimer, the term of this patent is extended or adjusted under 35 U.S.C. 154(b) by 295 days.

(21) Appl. No.: 12/748,714

(22) Filed: Mar. 29, 2010

(65) Prior Publication Data

US 2011/0057549 A1    Mar. 10, 2011

(30) Foreign Application Priority Data

Sep. 8, 2009   (JP) ................................ 2009-206783
Mar. 19, 2010  (JP) ................................ 2010-063861

(51) Int. Cl.
*H03H 9/205* (2006.01)
(52) U.S. Cl. ........................................ 310/370; 310/344
(58) Field of Classification Search .................. 310/344, 310/370
See application file for complete search history.

(56) References Cited

U.S. PATENT DOCUMENTS

| | | | | |
|---|---|---|---|---|
| 4,384,232 | A  * | 5/1983  | Debely ........................ | 310/370 |
| 6,911,765 | B2   | 6/2005  | Kawashima | |
| 7,015,630 | B2   | 3/2006  | Tanaya | |
| 7,084,556 | B1 * | 8/2006  | Dalla Piazza et al. ........ | 310/370 |
| 7,168,319 | B2 * | 1/2007  | Dalla Piazza et al. ...... | 73/504.16 |
| 2009/0115294 | A1 * | 5/2009  | Kikushima ................... | 310/370 |
| 2010/0327707 | A1 * | 12/2010 | Kizaki et al. .................. | 310/370 |
| 2011/0063041 | A1 * | 3/2011  | Yamada et al. ............... | 331/158 |
| 2011/0227452 | A1 * | 9/2011  | Yamada .................... | 310/323.01 |
| 2012/0092084 | A1 * | 4/2012  | Furuhata et al. .............. | 331/156 |

FOREIGN PATENT DOCUMENTS

| | | |
|---|---|---|
| JP | 60-194606 | * 10/1985 |
| JP | 02-032229 | 2/1990 |
| JP | 2002-204141 | 7/2002 |
| JP | 2004-200917 | 7/2004 |
| JP | 2004-260249 | 9/2004 |
| JP | 2005-151423 | 6/2005 |
| JP | 2008-011348 | 1/2008 |
| JP | 2009-117939 | * 5/2009 |
| WO | 00-44092 | 7/2000 |

OTHER PUBLICATIONS

Roszhart, T.V. et al., "The Effect of Thermoelastic Internal Friction on the Q of Micromachined Silicon Resonators", Kearfott Guidance & Navigation Corporation, Little Falls, N.J., Solid-State Sensor and Actuator Workshop, 1990, $4^{th}$ Technical Digest, IEEE, Jun. 4-7, 1990, pp. 13-16.

* cited by examiner

*Primary Examiner* — Thomas M Dougherty
(74) *Attorney, Agent, or Firm* — Harness, Dickey & Pierce, P.L.C.

(57) ABSTRACT

A flexural vibration piece includes a base, and a vibrating arms extending therefrom, each pair of vibrating arms has a first groove formed in the extension direction of the vibrating arm in one main surface following the direction in which the pair of vibrating arms are aligned, and a second groove formed side by side to the first groove in another main surface, the sum of the depths of the first and second groove portions is greater than the interval between the one main surface and the other main surface, and a mass portion is provided on each of the pair of vibrating arms, on the one main surface which is the opening side of the first grooves formed toward the outer sides opposite the inner sides on which the vibrating arms face each other.

13 Claims, 10 Drawing Sheets

FLEXURAL VIBRATION PIECE, FLEXURAL VIBRATOR, AND ELECTRONIC DEVICE

CROSS-REFERENCE TO RELATED APPLICATIONS

The entire disclosure of Japanese Patent Application No. 2009-206783, filed Sep. 8, 2009 and No. 2010-063861, filed Mar. 19, 2010 is expressly incorporated by reference herein.

BACKGROUND

1. Technical Field

The present invention relates to a flexural vibration piece, a flexural vibrator, and an electronic device.

2. Related Art

To date, it has been known that when a flexural vibration piece is downsized, the Q value decreases, and the vibration is inhibited.

To describe in detail, a flexural vibration piece is such that a temperature difference occurs inside due to the temperature of a compressing surface rising and the temperature of a stretching surface dropping accompanying an elastic deformation due to a flexural vibration. Because of this, a vibration called a thermal relaxation vibration, inversely proportional to a time needed (a relaxation time) until the temperature difference is eliminated (a temperature equilibration condition is attained) by heat conduction (heat transfer), occurs in the flexural vibration piece.

When downsizing the flexural vibration piece, the frequency of the thermal relaxation vibration and the frequency of the original flexural vibration come closer, meaning that a phenomenon occurs wherein the Q value decreases, and the original flexural vibration is inhibited. This phenomenon being called a thermoelastic loss, a thermoelastic effect, or the like, as an improvement measure, Laid-open Japanese Utility Model Publication No. 2-32229 attempts to suppress the decrease in the Q value caused by thermoelastic loss by forming a groove or a through hole in a rectangular cross-section of the flexural vibration piece, increasing the distance of a conduction path of a heat transfer from the compressing surface to the stretching surface, and causing the frequency of the flexural vibration and the frequency of the thermal relaxation vibration to diverge.

However, the flexural vibration piece is such that, when forming a through hole in a vibrating portion (hereafter referred to as a vibrating arm portion) as in Laid-open Japanese Utility Model Publication No. 2-32229, there is a problem in that the rigidity of the vibrating arm portion decreases markedly. Also, the flexural vibration piece is such that, even when providing grooves (hereafter referred to as groove portions) with an H type cross-sectional shape in the vibrating arm portion, as in Laid-open Japanese Utility Model Publication No. 2-32229, the suppressing of the heat transfer from the compressing surface to the stretching surface is insufficient, meaning that there is room for improvement in the suppressing of the decrease in the Q value caused by thermoelastic loss.

SUMMARY

The invention, being contrived in order to solve at least one of the heretofore described problems, can be realized as the following embodiments or application examples.

A flexural vibration piece according to the application example is characterized in that it includes a base portion, and a plurality of vibrating arm portions that extend from the base, portion and flexurally vibrate, and configures a tuning fork with the base portion and vibrating arm portions, wherein each of at least one pair of the vibrating arm portions has a first groove portion formed in the extension direction of the vibrating arm portion in one main surface, and a second groove portion formed side by side in plan view to the first groove portion in another main surface, the sum of the depth of the first groove portion and the depth of the second groove portion is greater than the interval between the one main surface and the other main surface, and a mass portion, which adds mass, is provided on each of the pair of vibrating arm portions, on the one main surface or the other main surface, which are the opening sides of the groove portions formed toward the outer sides opposite the inner sides on which the vibrating arm portions face each other. Also, in one embodiment, a flexural vibration piece is characterized by including a base portion, and a vibrating arm portion that extends in a first direction from the base portion and flexurally vibrates, wherein the vibrating arm portion includes a first main surface and second main surface opposing each other, a first groove portion formed in the first direction in the first main surface, and a second groove portion formed in the first direction in the second main surface, and wherein the first groove portion and second groove portion are arrayed in a second direction perpendicular to the first direction in planar view from a normal direction of the first main surface, each of a first depth of the first groove portion and a second depth of the second groove portion are smaller than the distance in the normal direction between the first main surface and second main surface, and the sum of the first depth and second depth is greater than the distance, and a mass portion is provided on at least one of the first main surface and second main surface. Also, the flexural vibration piece is characterized in that the vibrating arm portion has third and fourth main surfaces that connect the first main surface and second main surface, and which oppose each other, and their relationship is such that, due to the flexural vibration of the vibrating arm portion, when the third main surface is stretched, the fourth main surface is compressed, and when the third main surface is compressed, the fourth main surface is stretched. Also, the vibrating arm portion is characterized by including a first vibrating arm portion and a second vibrating arm portion extending side by side to each other from the base portion.

According to this configuration, the flexural vibration piece has a first groove portion formed in one main surface, and a second groove portion formed side by side in plan view to the first groove portion in another main surface, in each of a pair of vibrating arm portions, and the sum of the depth of the first groove portion and the depth of the second groove portion is greater than the interval between the one main surface and the other main surface.

Because of this, the flexural vibration piece is such that, for example, as the heat transfer distance from a compressing surface (one surface connecting the one main surface and the other main surface) to a stretching surface (another surface connecting the one main surface and the other main surface) during flexural vibration is long in comparison with the case in which the heretofore known kind of groove portions with the H type cross-sectional shape are provided in the vibrating arm portion, the relaxation time until the temperature equilibration condition is attained becomes longer.

As a result of this, the flexural vibration piece is such that, as the relaxation vibration frequency is caused to diverge from the frequency of the original flexural vibration, it is possible to suppress a drop in the Q value caused by thermoelastic loss. Consequently, it is possible to achieve a further downsizing of the flexural vibration piece.

However, the flexural vibration piece is such that the cross-sectional shape including the first groove portion and second groove portion cut along a plane perpendicular to the one main surface of the vibrating arm portion, and perpendicular to the extension direction of the vibrating arm portion, is not linearly symmetric about a center line between the one main surface and the other main surface, which is a straight line along the one main surface (the other main surface) passing through the central point of the straight line linking the one main surface and the other main surface.

Because of this, the flexural vibration piece is such that, as things stand, an imbalance in mass occurs in the vibrating arm portion, and the flexural vibration is a vibration wherein the original flexural vibration component along the one main surface is synthesized with an out-of-plane vibration component vibrating in the thickness direction, which is the direction linking the one main surface and the other main surface. As a result of this, the flexural vibration piece is such that the efficiency of the flexural vibration decreases.

In response to this, the flexural vibration piece is such that a mass portion, which adds mass, is provided on each of the pair of vibrating arm portions on the one main surface or the other main surface forming the opening sides of the groove portions provided toward the outer sides opposite the inner sides on which the vibrating arm portions face each other.

According to this configuration, the flexural vibration piece is such that, because the mass imbalance in the vibrating arm portion is alleviated by the mass portion, it is possible to reduce the out-of-plane vibration component of the flexural vibration caused by the mass imbalance.

As a result of this, the flexural vibration piece is such that the efficiency of the flexural vibration improves.

The flexural vibration piece according to the heretofore described application example is characterized in that, taking the flexural vibration frequency of the vibrating arm portion as f, the circumference ratio as $\pi$, the heat conductivity in the vibration direction of the material used for the vibrating arm portion as $\rho k$, the mass density of the material used for the vibrating arm portion as p, the heat capacity of the material used for the vibrating arm portion as $C_p$, and the width in the vibration direction of the vibrating arm portion as a, when $fm=\pi k/(2\rho C_p a^2)$, $0.09<f/fm$. More preferably, $0.25<f/fm$, and more preferably still, $1<f/fm$.

Because of this, as it is possible to cause the relaxation vibration frequency to diverge sufficiently from the flexural vibration frequency, the decrease in the Q value due to the thermoelastic effect is suppressed, and it is possible to realize a downsizing of the flexural vibration piece.

With the flexural vibration piece according to the heretofore described application example, it is preferable that the groove portions are arrayed so that the mass portions are provided on the main surfaces on the same side on the one vibrating arm portion and the other vibrating arm portion. Also, the flexural vibration piece is characterized in that the array direction of the first groove portion and second groove portion of the first vibrating arm portion, and the array direction of the first groove portion and second groove portion of the second vibrating arm portion, are the reverse of each other, in which case, the flexural vibration piece is characterized in that the mass portion of the first vibrating arm portion and the mass portion of the second vibrating arm portion are both formed on the first main surface side, or are both formed on the second main surface side.

According to this configuration, the flexural vibration piece is such that, because the mass portions are provided on the main surfaces on the same side on the one vibrating arm portion and the other vibrating arm portion, it is possible to carry out the formation of each mass portion at one time, without inverting the flexural vibration piece.

Because of this, the flexural vibration piece is such that productivity improves compared with a case in which the mass portions are provided on the main surfaces on different sides on the one vibrating arm portion and the other vibrating arm portion.

With the flexural vibration piece according to the heretofore described application example, it is preferable that the groove portions are arrayed so that the mass portions are provided on the main surfaces on the different sides on the one vibrating arm portion and the other vibrating arm portion. Also, the flexural vibration piece is characterized in that the array direction of the first groove portion and second groove portion of the first vibrating arm portion, and the array direction of the first groove portion and second groove portion of the second vibrating arm portion, are the same as each other, in which case, the flexural vibration piece is characterized in that one of the mass portion of the first vibrating arm portion and the mass portion of the second vibrating arm portion is provided on the first main surface, and the other is provided on the second main surface.

According to this configuration, the flexural vibration piece is such that the mass portions are provided on the main surfaces on different sides on the one vibrating arm portion and the other vibrating arm portion.

Because of this, the flexural vibration piece is such that, because the vibrating arm portions are displaced in mutually opposite directions when flexurally vibrating in the thickness direction of the vibrating arm portions, the thickness direction displacement components cancel each other out due to the interaction.

As a result of this, the flexural vibration piece is such that it is possible to reduce the out-of-plane vibration component, which is the thickness direction displacement component of the flexural vibration, more than in the case in which the mass portions are provided on the main surfaces on the same side on the one vibrating arm portion and the other vibrating arm portion.

With the flexural vibration piece according to the heretofore described application example, it is preferable that the mass portion is provided in at least the vicinity of a tip portion of the vibrating arm portion.

According to this configuration, the flexural vibration piece is such that, as the mass portion is provided at the tip portion of the vibrating arm portion, the distance from the base of the vibrating arm portion to the mass portion is long in comparison with a case in which it is provided on the base portion side, and it is possible to alleviate the mass imbalance of the vibrating arm portion with a small mass due to the moment of force.

With the flexural vibration piece according to the heretofore described application example, it is preferable that the mass portion is formed using a metal layer.

According to this configuration, the flexural vibration piece is such that, as the mass portion is formed of a metallic film, it is possible to easily form the mass portion using, for example, a versatile technique such as deposition, sputtering, photolithography, or etching.

With the flexural vibration piece according to the heretofore described application example, it is preferable that the mass portion has a linear expansion coefficient the same as, or similar to, that of the vibrating arm portion.

According to this configuration, the flexural vibration piece is such that, as the mass portion has a linear expansion coefficient the same as, or similar to, that of the vibrating arm portion, it is possible to suppress the occurrence of thermal stress caused by a difference in linear expansion coefficient between the two.

Consequently, the flexural vibration piece is such that it is possible to suppress a deformation of the vibrating arm portion, such as warping, caused by thermal stress.

With the flexural vibration piece according to the heretofore described application example, it is preferable that the flexural vibration piece is formed including a crystal.

According to this configuration, as the flexural vibration piece is formed including a crystal, it is possible to provide a flexural vibration piece having excellent characteristics, such as frequency-temperature characteristics and machining accuracy.

A flexural vibrator according to this application example, using the flexural vibration piece according to any one of the heretofore described application examples, is characterized by including the flexural vibration piece, and a package housing the flexural vibration piece, wherein the flexural vibration piece is housed in an internal space of the package, and the internal space of the package is hermetically sealed.

According to this configuration, the flexural vibrator is such that, as the flexural vibration piece according to any one of the heretofore described application examples is housed in the internal space of the package, and the internal space of the package is hermetically sealed, it is possible to provide a flexural vibrator including the flexural vibration piece which achieves the advantages described in the heretofore described application examples.

An electronic device according to this application example, using the flexural vibration piece according to any one of the heretofore described application examples, is characterized in including the flexural vibration piece, a circuit element that causes the flexural vibration piece to be driven, and a package housing at least the flexural vibration piece, wherein the flexural vibration piece is housed in an internal space of the package, and the internal space of the package is hermetically sealed.

According to this configuration, the electronic device is such that, as the flexural vibration piece according to any one of the heretofore described application examples, and the circuit element, are housed in the internal space of the package, and the internal space of the package is hermetically sealed, it is possible to provide an electronic device including the flexural vibration piece which achieves the advantages described in the heretofore described application examples.

DETAILED DESCRIPTION OF EXEMPLARY EMBODIMENTS

Figure 1:
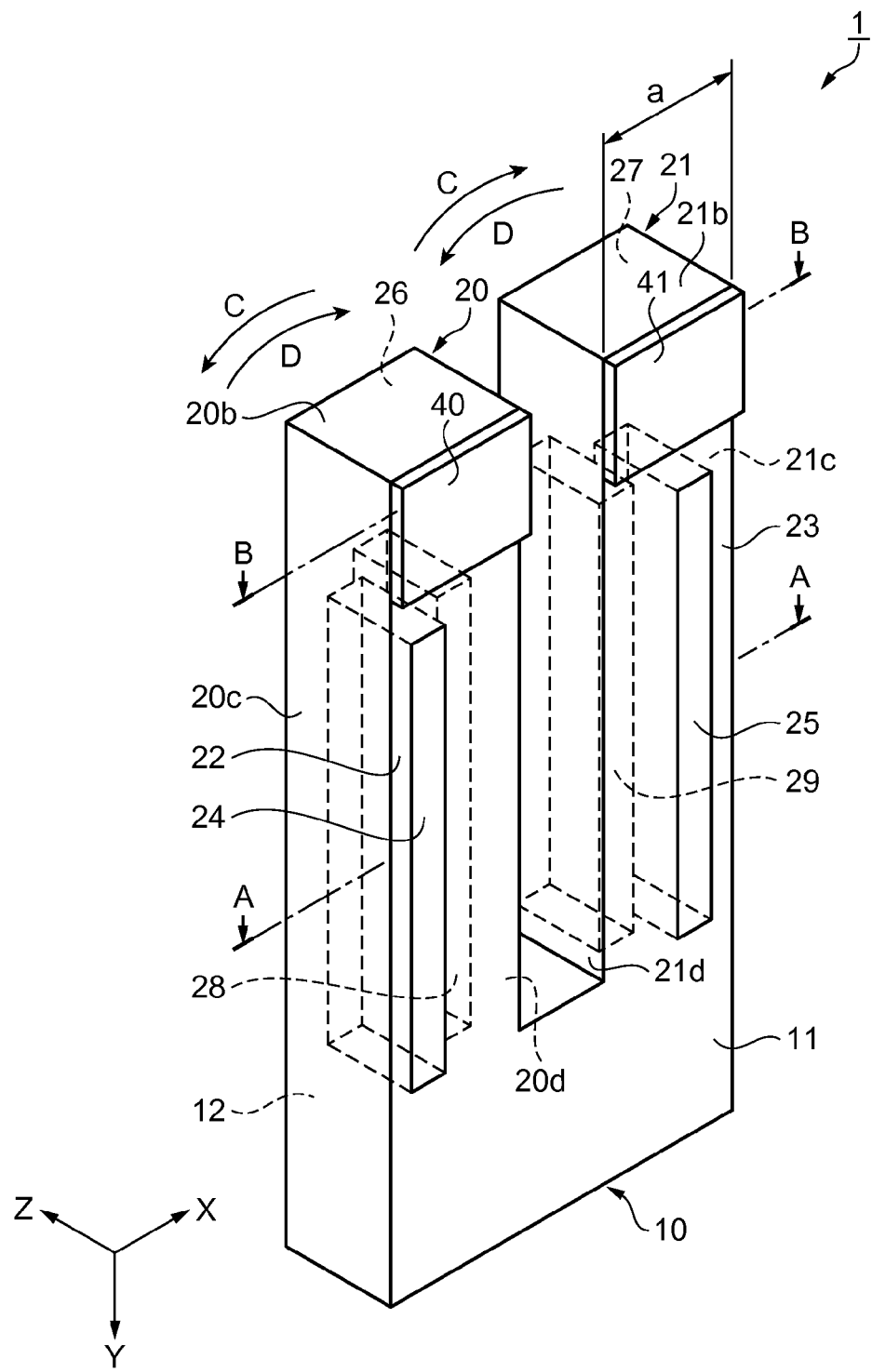
FIG. 1 is a schematic perspective view showing an outline configuration of a crystal vibration piece of a first embodiment.

Hereafter, a description will be given, in accordance with the drawings, of embodiments that embody the invention.

In first to third embodiments, a description is given citing, for example, a crystal vibration piece formed to include a crystal, which is one kind of piezoelectric body, as an example of a flexural vibration piece. Then, in a fourth embodiment and fifth embodiment, a description is given citing a crystal vibrator and crystal oscillator as examples of a flexural vibrator and electronic device using the crystal vibration piece.

Also, in each of the following embodiments, the description is given referring to an X axis, a Y axis, and a Z axis, wherein the axes indicate, respectively, a crystal X axis as an electrical axis, a crystal Y axis as a mechanical axis, and a crystal Z axis as an optical axis, which are crystal axes of the crystal. Also, in the following embodiments, it is taken that, the Z axis shown in the drawings inclining around one to five degrees with respect to the crystal Z axis, a plane defined by the Z axis and X axis may be formed inclining together with that inclination.

(First Embodiment)

Figure 2A:
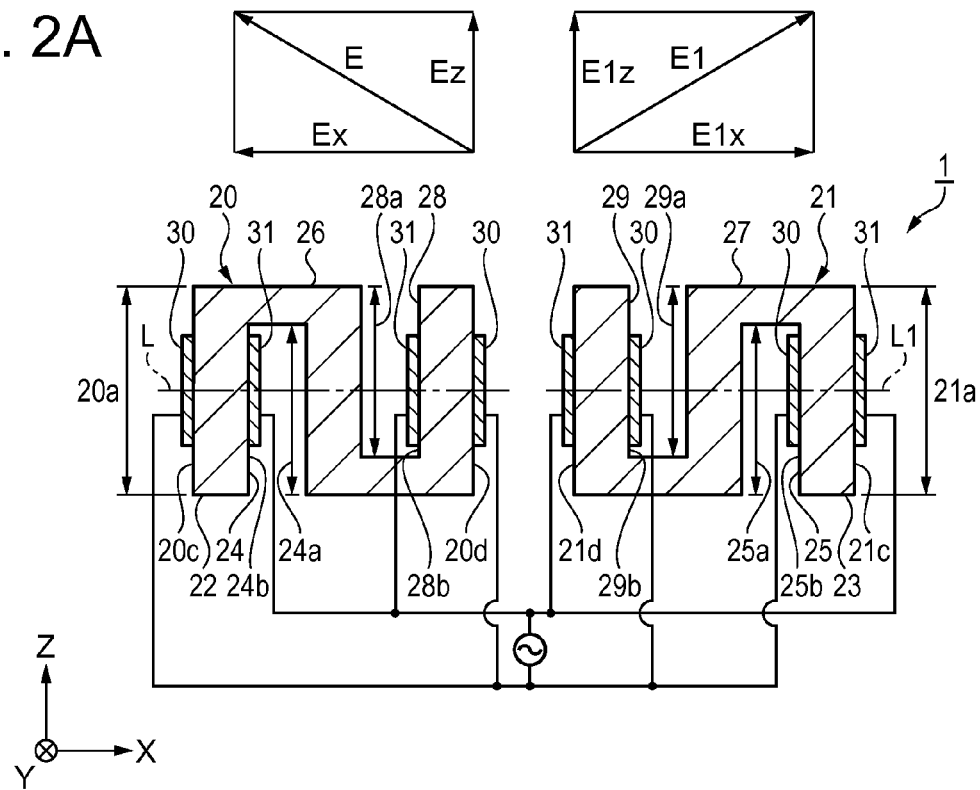
FIGS. 2(a) and 2(b) are schematic sectional views of FIG. 1.
Figure 2B:
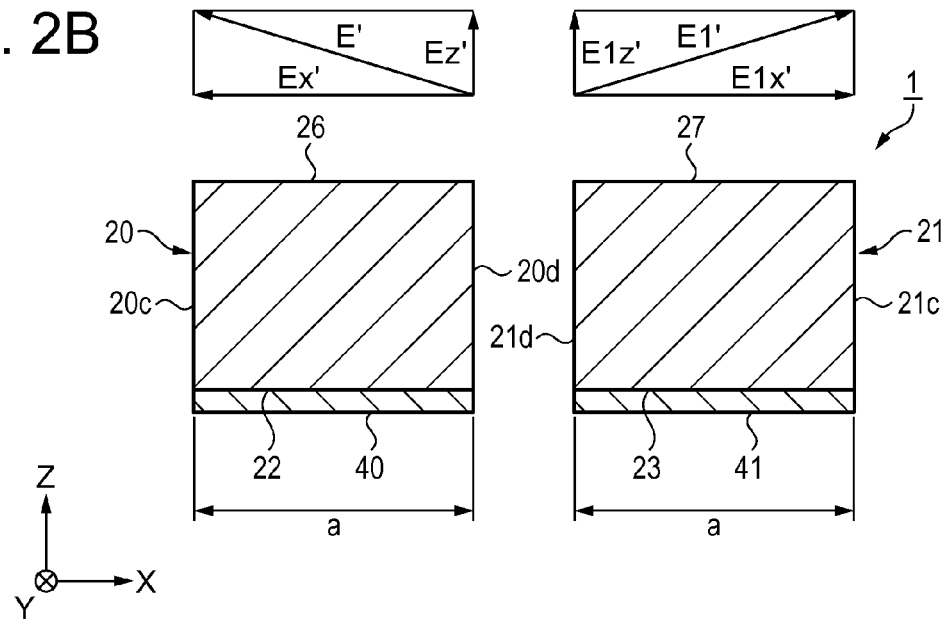

FIG. 1 is a schematic perspective view showing an outline configuration of the crystal vibration piece of the first embodiment. FIG. 2 is schematic sectional views of FIG. 1, wherein FIG. 2(a) is a sectional view-cum-wiring diagram along the A-A line of FIG. 1, and FIG. 2(b) is a sectional view along the B-B line of FIG. 1. In FIG. 1, electrodes are omitted for descriptive purposes.

As shown in FIG. 1 and FIG. 2, a crystal vibration piece 1 includes, for example, a base portion 10, and a pair of vibrating arm portions 20 and 21, extending from the base portion 10, which flexurally vibrate.

The crystal vibration piece 1 configures a tuning fork with the base portion 10 and pair of vibrating arm portions 20 and 21.

The pair of vibrating arm portions 20 and 21 are formed in, for example, a prismatic form, and extend from one end side of the base portion 10 in the Y axis direction, side by side to each other.

The base portion 10 and vibrating arm portions 20 and 21, after being cut out of a rough crystal, are ground to a tabular shape of a predetermined thickness, and formed into individual tuning fork shapes by etching, or the like.

Each of the pair of vibrating arm portions 20 and 21 has first groove portions 24 and 25 formed in one main surfaces 22 and 23 of the pair of vibrating arm portions 20 and 21 in the extension direction (the Y axis direction) of the vibrating arm portions 20 and 21, and second groove portions 28 and 29 formed in the other main surfaces 26 and 27 of the pair of vibrating arm portions 20 and 21, side by side to the first groove portions 24 and 25.

The one main surfaces 22 and 23 of the vibrating arm portions 20 and 21 run into one main surface 11 of the base portion 10, and the other main surfaces 26 and 27 run into another other main surface 12 of the base portion 10.

The first groove portions 24 and 25 and second groove portions 28 and 29, having a cross-sectional shape which is the shape of a letter S rotated 90 degrees, as shown in FIG. 2(a), are formed from the base of the vibrating arm portions 20 and 21 to the vicinity of tip portions 20b and 21b, as shown in FIG. 1.

Then, as shown in FIG. 2(a), the first groove portions 24 and 25 and second groove portions 28 and 29 of the vibrating arm portions 20 and 21 are formed in such a way that each of depths 24a and 25a of the first groove portions 24 and 25, and depths 28a and 29a of the second groove portions 28 and 29, are smaller than intervals 20a and 21a between the one main surfaces 22 and 23 and the other main surfaces 26 and 27, and that the sum of the depths 24a and 25a of the first groove portions 24 and 25 and depths 28a and 29a of the second groove portions 28 and 29 is greater than the intervals 20a and 21a between the one main surfaces 22 and 23 and the other main surfaces 26 and 27 ((24a+28a)>20a, (25a+29a)>21a). The first groove portions 24 and 25 and second groove portions 28 and 29 are formed by etching, sandblasting, or the like.

As shown in FIG. 2(a), exciting electrodes 30 and 31 are provided on each opposing side wall of the first groove portions 24 and 25 and second groove portions 28 and 29.

To describe in detail, in the vibrating arm portion 20, the exciting electrodes 30 are provided on one surface 20c connecting the one main surface 22 and the other main surface 26, and on another surface 20d connecting the one main surface and the other main surface 26. Also, the exciting electrodes 31 are provided on a surface 24b formed in the interior of the first groove portion 24, and on a surface 28b formed in the interior of the second groove portion 28. In the vibrating arm portion 21, the exciting electrodes 31 are provided on one surface 21c connecting the one main surface 23 and the other main surface 27, and on another surface 21d connecting the one main surface 23 and the other main surface 27. Also, the exciting electrodes 30 are provided on a surface 25b formed in the interior of the first groove portion 25, and on a surface 29b formed in the interior of the second groove portion 29.

The exciting electrodes 30 are connected to each other, the exciting electrodes 31 are connected to each other, each of them is drawn to the base portion 10 by an unshown extractor electrode, and connected to an unshown electrode pad.

The configuration is such that an alternating charge is applied between the exciting electrodes 30 and exciting electrodes 31.

The exciting electrodes 30 and 31 include an underlayer of chromium, nickel, or the like, and an electrode layer of gold, silver, or the like. Each layer is formed by deposition, sputtering, or the like.

A mass portion is provided on at least one of the one main surfaces 22 and 23 and other main surfaces 26 and 27 on each of the pair of vibrating arm portions 20 and 21. In the embodiment, mass portions 40 and 41, which add mass, are provided on the one main surfaces 22 and 23, which are the opening sides of the first groove portions 24 and 25 formed toward the outer sides opposite the inner sides on which the vibrating arm portions 20 and 21 face each other.

Because of this, the crystal vibration piece 1 is such that the groove portions are arrayed so that the mass portions 40 and 41 are provided on the one main surfaces 22 and 23, which are the same side, on the one vibrating arm portion 20 and the other vibrating arm portion 21.

The mass portions 40 and 41 are preferably formed in the vicinity of the tip portions 20b and 21b of the vibrating arm portions 20 and 21, having no effect on the formation positions of the exciting electrodes. As the material of the mass portions 40 and 41, although not being particularly limited, a single metal such as gold, silver, titanium, aluminum, chromium, or nickel, or an alloy using them, a piezoelectric body such as zinc oxide, and an insulator such as silicon dioxide, are included. Also, the mass portions 40 and 41 may also be formed by making the tip portions of the vibrating arm portions 20 and 21 thicker than other portions. The mass portions 40 and 41 are formed on the vibrating arm portions 20 and 21 using a technique such as deposition, sputtering, photolithography, or etching. It is preferable that a metallic film made, for ease of formation, from the heretofore mentioned metals, or the like, is used for the mass portions 40 and 41.

A material with a high specific gravity being preferable for the mass portions 40 and 41, a material with a linear expansion coefficient the same as, or similar to, that of a crystal is preferable in order to suppress thermal stress.

Herein, a description will be given of an operation of the crystal vibration piece 1.

When an alternating charge is applied as a drive signal between the exciting electrodes 30 and 31, the vibrating arm portions 20 and 21 of the crystal vibration piece 1 carry out a flexural vibration whereby they are alternately displaced in the arrow C directions and arrow D directions of the X axis direction, as shown in FIG. 1.

Specifically, when a positive charge is applied to the exciting electrode 30 and a negative charge is applied to the exciting electrode 31, the one surfaces 20c and 21c is compressed, and the other surfaces 20d and 21d is stretched. Because of this, the vibrating arm portions 20 and 21 are displaced in the arrow C directions.

Meanwhile, when a negative charge is applied to the exciting electrode 30 and a positive charge is applied to the exciting electrode 31, the one surfaces 20c and 21c is stretched, and the other surfaces 20d and 21d is compressed. Because of this, the vibrating arm portions 20 and 21 are displaced in the arrow D directions.

At this time, as shown in FIG. 2(a), with the cross-sectional shape in which the first groove portions 24 and 25 and second groove portions 28 and 29 of the vibrating arm portions 20 and 21 are formed ((24a+28a)>20a, (25a+29a)>21a), the heat transfer distance from the one surface 20c to the other surface 20d, and the heat transfer distance from the one surface 21c to the other surface 21d, are long in comparison with the heretofore known kind of case in which groove portions with an H type of cross-sectional shape are provided.

To describe the heat transfer distances in detail, in the vibrating arm portion 20, it is the distance from one end of the first groove portion 24 opening side of the one surface 20c to one end of the second groove portion 28 opening side of the other surface 20d along the cross-sectional shape, and in the vibrating arm portion 21, it is the distance from one end of the first groove portion 25 opening side of the one surface 21c to one end of the second groove portion 29 opening side of the other surface 21d along the cross-sectional shape.

When compression occurs in the surfaces 20c and 21c, expansion occurs in the surfaces 20d and 21d and second groove portions 28 and 29. Then, compression occurs in the first groove portions 24 and 25. Conversely, when expansion occurs in the surfaces 20c and 21c, compression occurs in the surfaces 20d and 21d and second groove portions 28 and 29. Then, expansion occurs in the first groove portions 24 and 25. Because of this, the surfaces 20c and 20d, and the surfaces 21c and 21d, which are disposed opposing each other, stretch and compress alternately due to the flexural vibration. Then, as the temperature of the compressed surfaces rises, and the temperature of the stretched surfaces drops, a temperature difference occurs inside the flexural vibration piece between the surface 20c and surface 20d, and between the surface 21c and surface 21d. There occurs a relaxation vibration of a relaxation vibration frequency $f_0$ inversely proportional to a relaxation time τ until temperature equilibration of the temperature difference by heat conduction (heat transfer). Herein, the relaxation vibration frequency $f_0$ and relaxation time τ are expressed by $f_0=1/(2\pi\tau)$. In the present application, the symbol "/" represents division.

Generally, it is known that a relaxation vibration frequency fm of the vibrating arms when the first groove portions and second groove portions are not provided is decided by the following equation.

$$fm = \pi k/(2\rho C_p a^2) \quad (1)$$

Herein, π is the circumference ratio, k is the heat conductivity in the vibration direction of the vibrating arm portion, ρ is the mass density of the vibrating arm portion, $C_p$ is the heat capacity of the vibrating arm portion, and a is the width in the vibration direction of the vibrating arm portion.

When inputting constants of the vibrating arm portion material itself as the heat conductivity k, mass density ρ, and heat capacity $C_p$ of the Equation (1), the relaxation vibration frequency fm obtained is the relaxation vibration frequency of the vibrating arm portions when the first groove portions 24 and 25 and second groove portions 28 and 29 are not provided in the vibrating arm portions.

That is, the crystal vibration piece 1 of the invention is such that, as the transfer distance of the heat occurring due to the compression and expansion of the vibrating arms is longer than that heretofore known due to the first groove portions 24 and 25 and second groove portions 28 and 29, the relaxation time τ until the temperature equilibration condition is attained is longer than that heretofore known. As a result of this, the crystal vibration piece 1 is such that the thermal relaxation frequency $f_0$ diverges from a frequency f of the original flexural vibration.

Figure 3:
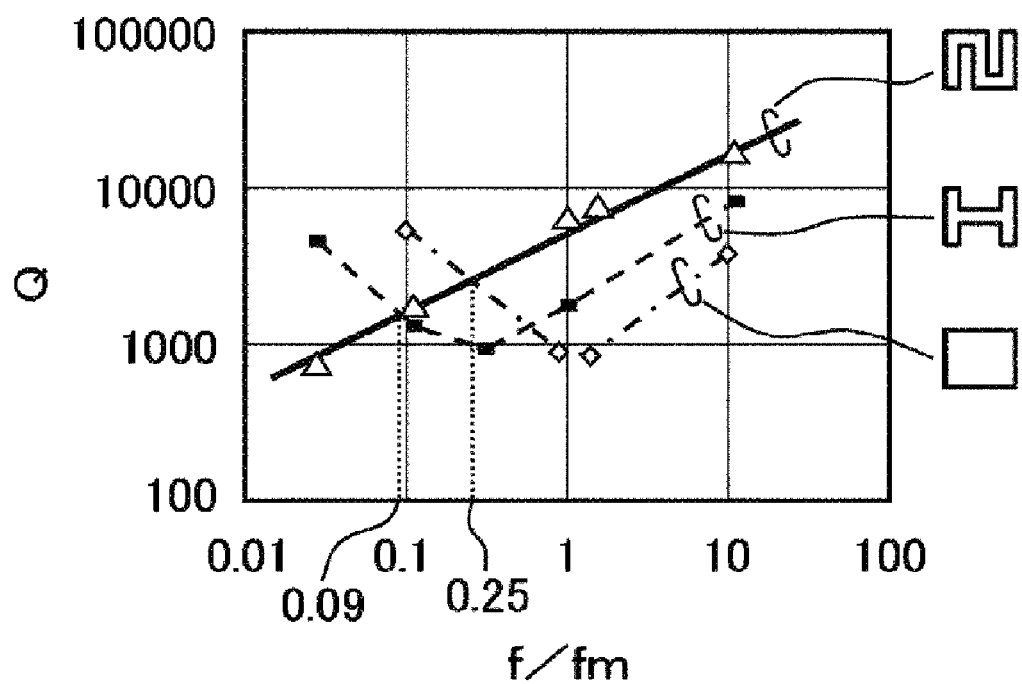
FIG. 3 is a graph, representing the dependency of Q of various kinds of flexural vibration piece on f/fm, showing a comparison by difference in cross-sectional shape of a vibrating arm portion.

FIG. 3 is a graph showing the dependency of Q of the flexural vibration piece (crystal vibration piece) on f/fm. Herein, fm being the relaxation vibration frequency when not providing the first groove portions and second groove portions in the vibrating arm portions (when the cross-sectional shape of the vibrating arm portions is rectangular), the definition is taken to be the same in other embodiments too. The shapes shown on the right side of the graph of FIG. 3 are shapes schematically representing the cross-sectional shape of the vibrating arm portions.

In FIG. 3, the triangular markers are plots in the case of the cross-sectional shape of FIG. 2(a), the black rectangular markers in the case of the so-called H type, wherein the cross-sectional shape of the vibrating arms is made an "H" by providing groove portions in the opposing main surfaces of the vibrating arm portions, and the white diamond-shaped markers in the case of a so-called plate, wherein no groove portion is provided in any main surface of the vibrating arm portions. Also, the thick solid line is an approximate straight line of the values of the triangular markers, the broken line is an interpolation straight line between the rectangular markers, and the dashed-dotted line is an interpolation straight line between the diamond-shaped markers.

As shown in the same drawing, by making the cross-sectional shape of the vibrating arm portions as in FIG. 2(a), and making f/fm a value greater than 0.09, it is clear that a flexural vibration piece with a Q value higher than in the case of the heretofore known H type is realized. Furthermore, by making f/fm a value greater than 0.25, it is possible to realize a flexural vibration piece with a Q value higher than in the case of either the H type or the plate type. By making f/fm a value greater than 1, the Q value becomes dramatically higher than either the H type or plate type.

However, the crystal vibration piece 1 is such that the cross-sectional shape of the vibrating arm portions 20 and 21 including the first groove portions 24 and 25 and second groove portions 28 and 29 shown in FIG. 2(a) is not a shape linearly symmetric about the center line L, L1 between the one main surfaces 22 and 23 and the other main surfaces 26 and 27.

Because of this, the crystal vibration piece 1 is such that, as things stand, an imbalance in mass occurs in the vibrating arm portions 20 and 21. As shown in FIG. 2(a), when the vibrating arm portion 20 vibrates in an Ex direction, a displacement E of the flexural vibration of the vibrating arm portion 20 is a displacement wherein the displacement component Ex of the original flexural vibration vibrating in the X axis direction is synthesized with a displacement component Ez of the out-of-plane vibration vibrating in the Z axis direction, which is the direction linking the one main surfaces 22 and 23 and other main surfaces 26 and 27, due to a Z axis direction moment.

Meanwhile, when the vibrating arm portion 21 vibrates in an E1x direction, a displacement E1 of the flexural vibration of the vibrating arm portion 21 is a displacement wherein the displacement component E1x of the original flexural vibration vibrating in the X axis direction is synthesized with a displacement component E1z unnecessary for the flexural vibration vibrating in the Z axis direction, which is the direction linking the one main surfaces 22 and 23 and other main surfaces 26 and 27, due to the Z axis direction moment. The displacement component Ez and the displacement component E1z are displacement components in the same direction.

As a result of this, the crystal vibration piece 1 is such that the directions of the displacements E and E1 of the flexural vibration deviate from the displacement components Ex and E1x of the original flexural vibration. Because of this, there is a danger of a loss in vibration energy occurring, and the efficiency of the flexural vibration decreasing.

Although, in FIG. 2, the displacements E and E1 in one direction of the flexural vibration (corresponding to the direction of the arrows C of FIG. 1) are shown for descriptive purposes, an unnecessary vibration in the Z direction is added to the displacement component of the flexural vibration in the X direction in the same way in the case of a displacement in the opposite direction (corresponding to the direction of the arrows D of FIG. 1) too. However, the displacement component of the flexural vibration in the X axis direction of the vibrating arm portions 20 and 21 in the direction of the arrows D is small in comparison with the displacement component of the flexural vibration in the X axis direction of the vibrating arm portions 20 and 21 in the direction of the arrows C. Consequently, the unnecessary vibration component in the Z direction when vibrating in the direction of the arrows D is smaller than the unnecessary vibration component in the Z direction when vibrating in the direction of the arrows C, and the effect on the displacement component of the flexural vibration in the X axis direction is small.

In the invention, in order to solve the heretofore described problem, the mass portions 40 and 41 are formed in the vicinity of the tip portions of the vibrating arm portions 20 and 21, as shown in FIG. 2(b), and the unnecessary vibration in the Z direction is reduced with the mass portions 40 and 41. Specifically, the mass portions 40 and 41, which add mass, are provided on the main surfaces 22 and 23 forming the opening sides of the first groove portions 24 and 25 formed toward the outer sides opposite the inner sides on which the vibrating arm portions face each other.

The crystal vibration piece 1 is such that, by the mass portions 40 and 41 being provided on the main surfaces 22 and 23 of the vibrating arm portions 20 and 21, the mass imbalance of the vibrating arm portions 20 and 21 is alleviated.

Because of this, the crystal vibration piece 1 is such that, because out-of-plane vibration displacement components Ez' and E1z' of displacements E' and E1' of the flexural vibration are reduced due to the reduction of the Z axis direction moment, and displacement components Ex' and E1x' of the original flexural vibration increase by that amount, the direction of the displacements E' and E1' of the flexural vibration comes closer to the X axis direction, which is the original flexural vibration direction.

As a result of this, the crystal vibration piece 1 is such that the loss of vibration energy is suppressed.

The mass of the mass portions 40 and 41 is appropriately set in accordance with the size of the vibrating arm portions of the crystal vibration piece 1, the size of each groove portion, and the like.

As heretofore described, the crystal vibration piece 1 of the first embodiment is such that the pair of vibrating arm portions 20 and 21 have, respectively, the first groove portions 24 and 25 formed in the main surfaces 22 and 23, and the second groove portions 28 and 29 formed in the main surfaces 26 and 27, side by side to the first groove portions 24 and 25. Then, the crystal vibration piece 1 is such that the sum of the depths 24a and 25a of the first groove portions 24 and 25 and depths 28a and 29a of the second groove portions 28 and 29 is greater than the intervals 20a and 21a between the one main surfaces 22 and 23 and the other main surfaces 26 and 27 ((24a+28a)>20a, (25a+29a)>21a).

Because of this, the crystal vibration piece 1 is such that, as the heat transfer distance from a compressing surface to a stretching surface during flexural vibration, specifically, from the surfaces 20c and 21c to the surfaces 20d and 21d, or from the surfaces 20d and 21d to the surfaces 20c and 21c, is long in comparison with the case in which the heretofore known kinds of groove portion with the H type cross-sectional shape are provided in the vibrating arm portions 20 and 21, the relaxation time τ until the temperature equilibration condition is attained becomes longer.

As a result of this, the crystal vibration piece 1 is such that, as the thermal relaxation vibration frequency $f_0$ is caused to diverge from the frequency f of the original flexural vibration, it is possible to suppress a drop in the Q value caused by thermoelastic loss. Consequently, it is possible to achieve a further downsizing of the crystal vibration piece 1.

Also, the crystal vibration piece 1 is such that, due to the mass imbalance accompanying the fact that the cross-sectional shape shown in FIG. 2(a) is not linearly symmetric about a center line L, L1 in the Z direction of the vibrating arms, the displacements E and E1 of the flexural vibration are displacements wherein the displacement components Ex and E1x of the original flexural vibration vibrating in the X axis direction are synthesized with the displacement components Ez and E1z of the unnecessary vibration vibrating in the Z axis direction, the direction of the displacements E and E1 of the flexural vibration deviates from the X axis direction, which is the direction of the flexural vibration, and there is a danger of a loss in vibration energy occurring, and the efficiency of the flexural vibration decreasing.

In response to this, the crystal vibration piece 1 is such that, by the mass imbalance of the vibrating arm portions 20 and 21 being alleviated by the mass portions 40 and 41 being added, as shown in FIG. 2(b), the out-of-plane vibration displacement components Ez' and E1z' of the displacements E' and E1' of the flexural vibration after the addition of the mass portions 40 and 41 are reduced, and the displacement components Ex' and E1x' of the original flexural vibration increase by that amount, meaning that the direction of the displacements E' and E1' of the flexural vibration comes closer to the original direction along the one main surfaces 22 and 23.

As a result of this, the crystal vibration piece 1 is such that the loss of vibration energy is suppressed, and the efficiency of the flexural vibration improves.

Also, the crystal vibration piece 1 is such that, as the mass portions 40 and 41 are provided on the one main surfaces 22 and 23, which are the same side, on the one vibrating arm portion 20 and the other vibrating arm portion 21, it is possible to carry out the formation of the mass portions 40 and 41 at one time, using a technique such as deposition, sputtering, photolithography, or etching, without inverting the crystal vibration piece 1 each time.

Because of this, the crystal vibration piece 1 is such that productivity improves compared with a case in which the mass portions 40 and 41 are provided on the one main surface 22 and the other main surface 27, which are different sides, on the one vibrating arm portion 20 and the other vibrating arm portion 21.

Also, the crystal vibration piece 1 is such that, as the mass portions 40 and 41 are provided at the tip portions 20b and 21b of the vibrating arm portions 20 and 21, the distance from the base of the vibrating arm portions 20 and 21 to the mass portions 40 and 41 is long in comparison with a case in which they are provided on the base portion 10 side, and it is possible to alleviate the mass imbalance of the vibrating arm portions 20 and 21 with a small mass due to the moment of force.

Also, the crystal vibration piece 1 is such that, in the event that the mass portions 40 and 41 are formed of a metallic film, it is possible to easily form the mass portions 40 and 41 using a versatile technique such as deposition, sputtering, photolithography, or etching.

Also, the crystal vibration piece 1 is such that, in the event that the mass portions 40 and 41 have a linear expansion coefficient the same as, or similar to, that of the vibrating arm portions 20 and 21, it is possible to suppress the occurrence of thermal stress caused by a difference in linear expansion coefficient between the two.

Consequently, the crystal vibration piece 1 is such that it is possible to suppress a problem caused by thermal stress, such as a deformation of the vibrating arm portions 20 and 21, like warping, or a rise in a CI (crystal impedance) value.

Also, as the crystal vibration piece 1 is formed including a crystal, it is possible to provide a crystal vibration piece 1 having excellent characteristics, such as frequency-temperature characteristics and machining accuracy.

In the heretofore described embodiment, a description is given with a tuning fork vibrator having two vibrating arm portions as an example, but the invention is also applicable to a tuning fork vibrator having one or more vibrating arm portions. Also, the mass portions 40 and 41 are formed on only one main surface of the vibrating arm portions 20 and 21, but they may also be formed on both main surfaces. In this case, it is preferable that the weight of the mass portions formed on the one main surface and that of the mass portions formed on the other surface are different.

(Second Embodiment)

Figure 4:
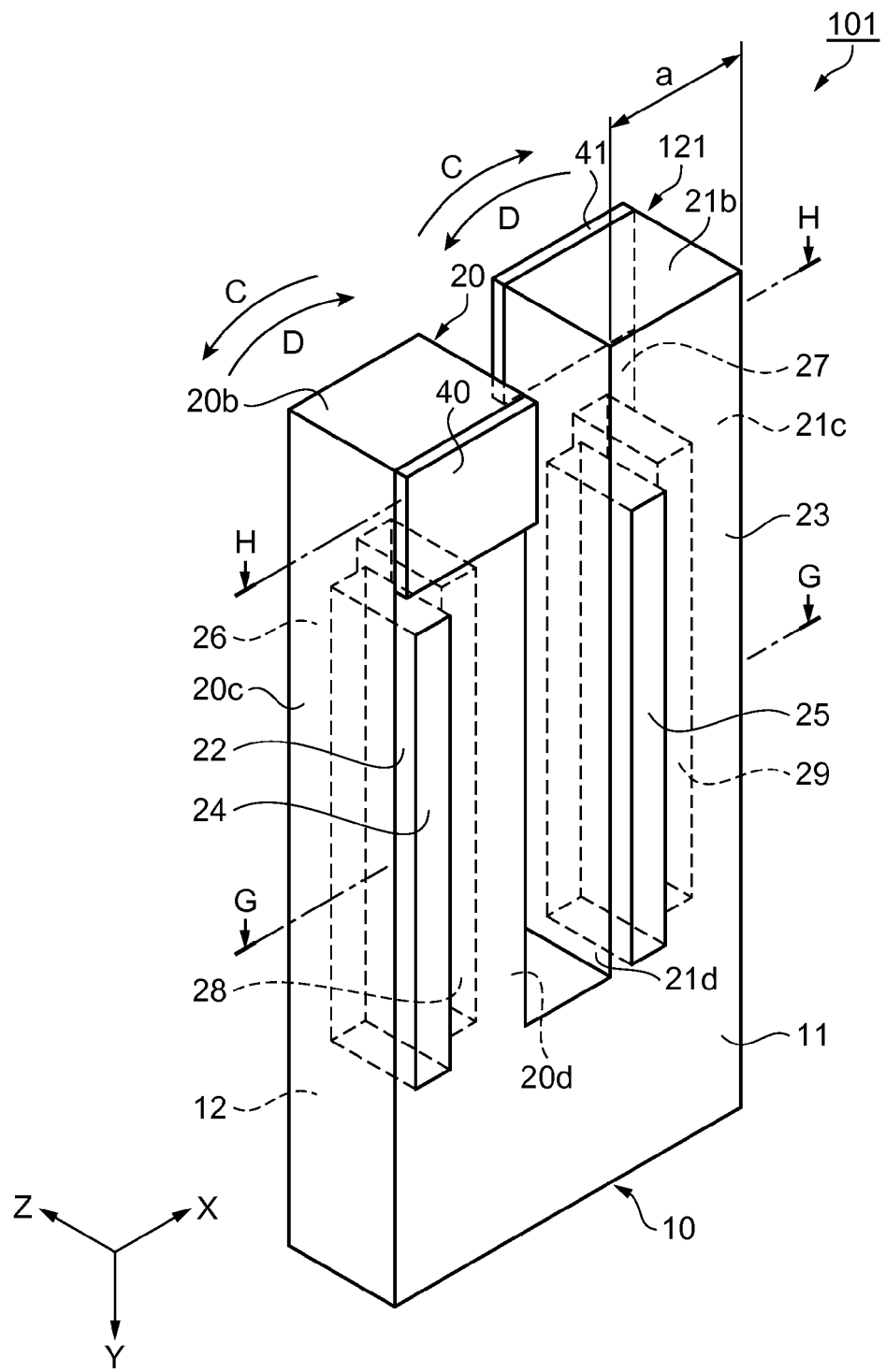
FIG. 4 is a schematic perspective view showing an outline configuration of a crystal vibration piece of a second embodiment.
Figure 5A:
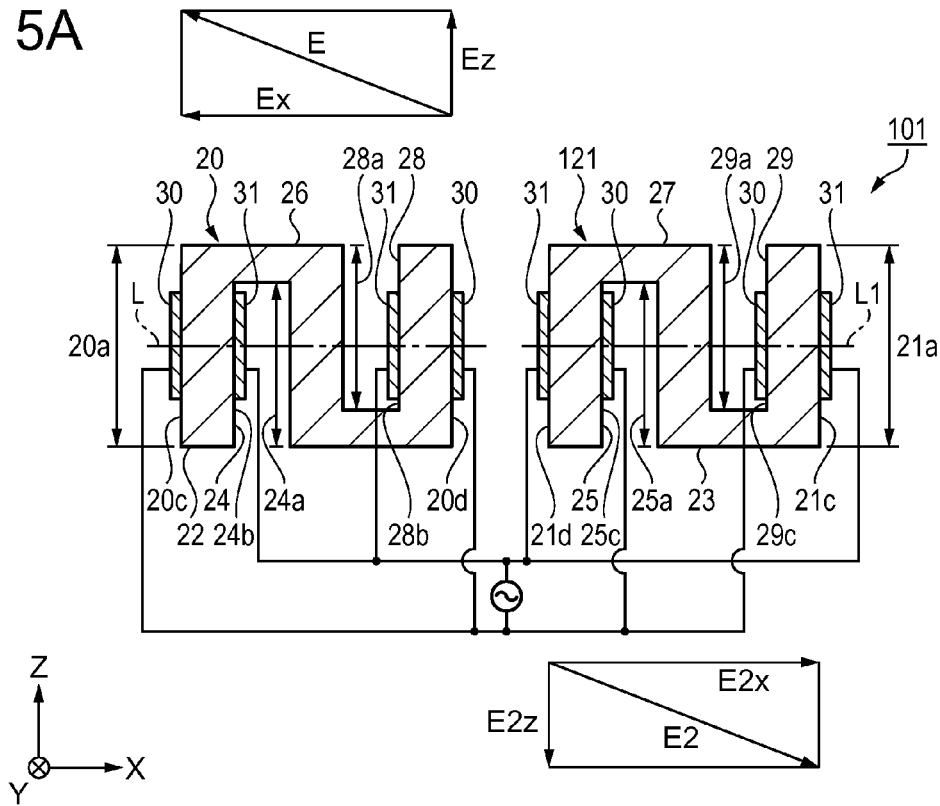
FIGS. 5(a) and 5(b) are schematic sectional views of FIG. 4.
Figure 5B:
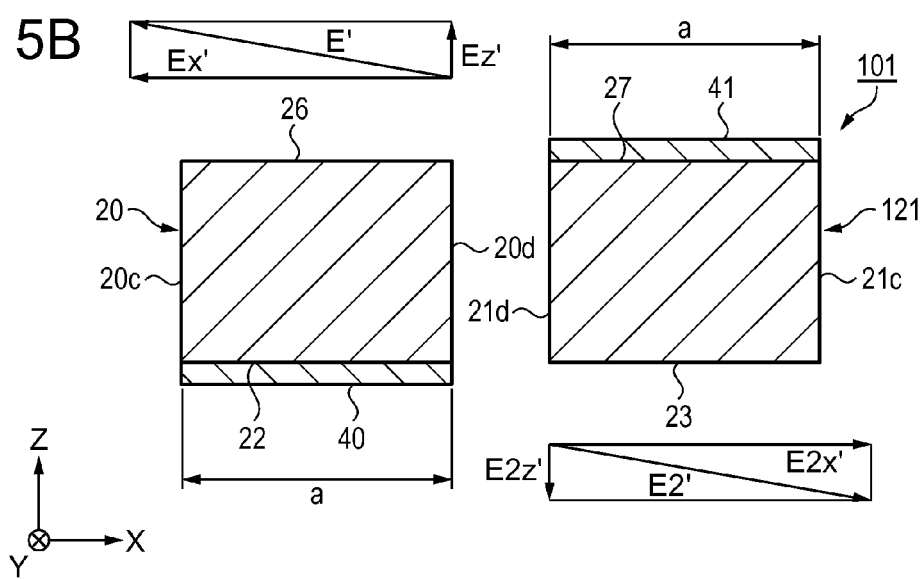

FIG. 4 is a schematic perspective view showing an outline configuration of the crystal vibration piece of the second embodiment. FIG. 5 is schematic sectional views of FIG. 4, wherein FIG. 5(a) is a sectional view-cum-wiring diagram along the G-G line of FIG. 4, and FIG. 5(b) is a sectional view along the H-H line of FIG. 4. In FIG. 4, electrodes are omitted for descriptive purposes. Also, the same reference numerals and signs will be given to portions had in common with the first embodiment, a description will be omitted, and a description will be given centered on portions differing from the first embodiment.

As shown in FIG. 4, a crystal vibration piece 101 of the second embodiment is such that the array of the first groove portion 25 and second groove portion 29 of a vibrating arm portion 121 is the reverse of that of the vibrating arm portion 21 of the first embodiment.

Because of this, the crystal vibration piece 101 is such that the opening side surfaces of the groove portions 24 and 29, the ones formed toward the outer sides of the pair of vibrating arm portions 20 and 121, differ between the one vibrating arm portion 20 and the other vibrating arm portion 121.

That is, in the vibrating arm portion 20, the opening side surface of the first groove portion 24 formed toward the outer side is the one main surface 22, and in the vibrating arm portion 121, the opening side surface of the second groove portion 29 formed toward the outer side is the other main surface 27 on the side opposite the one main surface 22.

Because of this, the crystal vibration piece 101 is such that the mass portion 40 is provided on the one main surface 22 of the vibrating arm portion 20, and the mass portion 41 is provided on the other main surface 27 of the vibrating arm portion 121.

In other words, the crystal vibration piece 101 is such that the groove portions are arrayed in such a way that the mass portions 40 and 41 are provided respectively on the one main surface 22 and the other main surface 27, which are different sides, on the one vibrating arm portion 20 and the other vibrating arm portion 121.

As shown in FIG. 5(a), in the vibrating arm portion 121, the exciting electrodes 30 are provided on a surface 25c toward the other surface 21d in the first groove portion 25, and on a surface 29c toward the other surface 21c in the second groove portion 29, and the exciting electrodes 31 are provided on the other surface 21c and the other surface 21d.

Herein, a description will be given of an operation of the crystal vibration piece 101.

When an alternating charge is applied as a drive signal between the exciting electrodes 30 and 31, the vibrating arm portions 20 and 121 of the crystal vibration piece 101 carry out a flexural vibration whereby they are alternately displaced in the arrow C directions and arrow D directions of the X axis direction, as shown in FIG. 4.

However, as shown in FIG. 5(a), the crystal vibration piece 101 is such that the cross-sectional shape of the vibrating arm portions 20 and 121 including the first groove portions 24 and 25 and second groove portions 28 and 29 is not a shape linearly symmetric about the center line L, L1 between the one main surfaces 22 and 23 and the other main surfaces 26 and 27.

Because of this, the crystal vibration piece 101 is such that, as things stand, an imbalance in mass occurs in the vibrating arm portions 20 and 121 and, as shown in FIG. 5(a), the displacement E of the flexural vibration of the one vibrating arm portion 20 is a displacement wherein the displacement component Ex of the original flexural vibration vibrating in the X axis direction is synthesized with the displacement component Ez of the out-of-plane vibration vibrating in the Z axis direction due to the Z axis direction moment.

Meanwhile, a displacement E2 of the flexural vibration of the other vibrating arm portion 121 is a displacement wherein a displacement component E2x of the original flexural vibration vibrating in the X axis direction is synthesized with a displacement component E2z of the out-of-plane vibration vibrating in the Z axis direction due to the Z axis direction moment.

As a result of this, the crystal vibration piece 101 is such that, because the directions of the displacements E and E2 of the flexural vibration do not follow the original flexural vibration vibrating in the X axis direction, there is a danger of a loss in vibration energy occurring, and the efficiency of the flexural vibration decreasing.

Although, in FIG. 5, the displacements E and E2 in one direction of the flexural vibration (corresponding to the direction of the arrows C of FIG. 4) are shown for descriptive purposes, an unnecessary vibration in the Z direction is added to the displacement component of the flexural vibration in the X direction in the same way in the case of a displacement in the opposite direction (corresponding to the direction of the arrows D of FIG. 4) too. However, the displacement component of the flexural vibration in the X axis direction of the vibrating arm portions 20 and 121 in the direction of the arrows D is small in comparison with the displacement component of the flexural vibration in the X axis direction of the vibrating arm portions 20 and 121 in the direction of the arrows C. Consequently, the unnecessary vibration component in the Z direction when vibrating in the direction of the arrows D is smaller than the unnecessary vibration component in the Z direction when vibrating in the direction of the arrows C, and the effect on the displacement component of the flexural vibration in the X axis direction is small.

In response to this, the crystal vibration piece 101 is such that, as shown in FIG. 5(b), the mass portions 40 and 41 are provided on the one main surface 22 and the other main surface 27 forming the opening sides of the first groove portion 24 and second groove portion 29 formed toward the outer sides opposite the inner sides on which the vibrating arm portions 20 and 121 face each other.

The crystal vibration piece 101 is such that, by the mass portions 40 and 41 being formed on the one main surface 22 and the other main surface 27 of the vibrating arm portions 20 and 121, the mass imbalance of the vibrating arm portions 20 and 121 is alleviated.

Because of this, the crystal vibration piece 101 is such that, because out-of-plane vibration displacement components Ez' and E2z' of displacements E' and E2' of the flexural vibration after the addition of the mass portions 40 and 41 are reduced due to the reduction of the Z axis direction moment, and displacement components Ex' and E2x' of the original flexural vibration increase by that amount, the direction of the displacements E' and E2' of the flexural vibration comes closer to the original direction along the one main surfaces 22 and 23.

As a result of this, the crystal vibration piece 101 is such that the loss of vibration energy is suppressed.

At this time, the crystal vibration piece 101 is such that, because the displacement directions of the out-of-plane vibration displacement components Ez and E2z when the vibrating arm portions 20 and 121 flexurally vibrate are mutually opposite directions, as shown in FIG. 5(a), the displacement components Ez and E2z cancel each other out due to the interaction.

As a result of this, the crystal vibration piece 101 is such that, as shown in FIG. 5(b), the out-of-plane vibration displacement components Ez' and E2z' of the displacements E' and E2' of the flexural vibration after forming the mass portions 40 and 41 decrease further, and the displacement components Ex' and E2x' of the original flexural vibration increase further, than in the first embodiment.

As a specific numerical example of the above, while Ez/Ex of the crystal vibration piece 1 of the first embodiment is approximately 0.63, Ez/Ex of the crystal vibration piece 101 of the second embodiment is approximately 0.41.

The mass of the mass portions 40 and 41 is appropriately set in accordance with the size of the vibrating arm portions 20 and 121 of the crystal vibration piece 101, the size of each groove portion, and the like.

As heretofore described, the crystal vibration piece 101 of the second embodiment is such that the groove portions are arrayed in such a way that the mass portions 40 and 41 are provided respectively on the one main surface 22 and the other main surface 27, which are different sides, on the one vibrating arm portion 20 and the other vibrating arm portion 121.

Because of this, the crystal vibration piece 101 is such that, because the displacement directions of the out-of-plane vibration (Z direction) displacement components Ez and E2z when the vibrating arm portions 20 and 121 flexurally vibrate are mutually opposite directions, the displacement components Ez and E2z cancel each other out due to the interaction.

As a result of this, the crystal vibration piece 101 is such that the out-of-plane vibration displacement components Ez' and E2z' of the displacements E' and E2' of the flexural vibration after the addition of the mass portions 40 and 41 decrease further, and the displacement components Ex' and E2x' of the original flexural vibration increase further, than in the first embodiment.

Because of this, the crystal vibration piece 101 is such that the direction of the displacements E' and E2' of the flexural vibration comes closer to the original direction along the one main surfaces 22 and 23.

Consequently, the crystal vibration piece 101 is such that the loss in vibration energy is further suppressed, and the efficiency of the flexural vibration improves further, than in the first embodiment.

(Third Embodiment)

Hereafter, a description will be given, referring to FIG. 6, FIG. 7, and FIG. 8, of the third embodiment.

Figure 6:
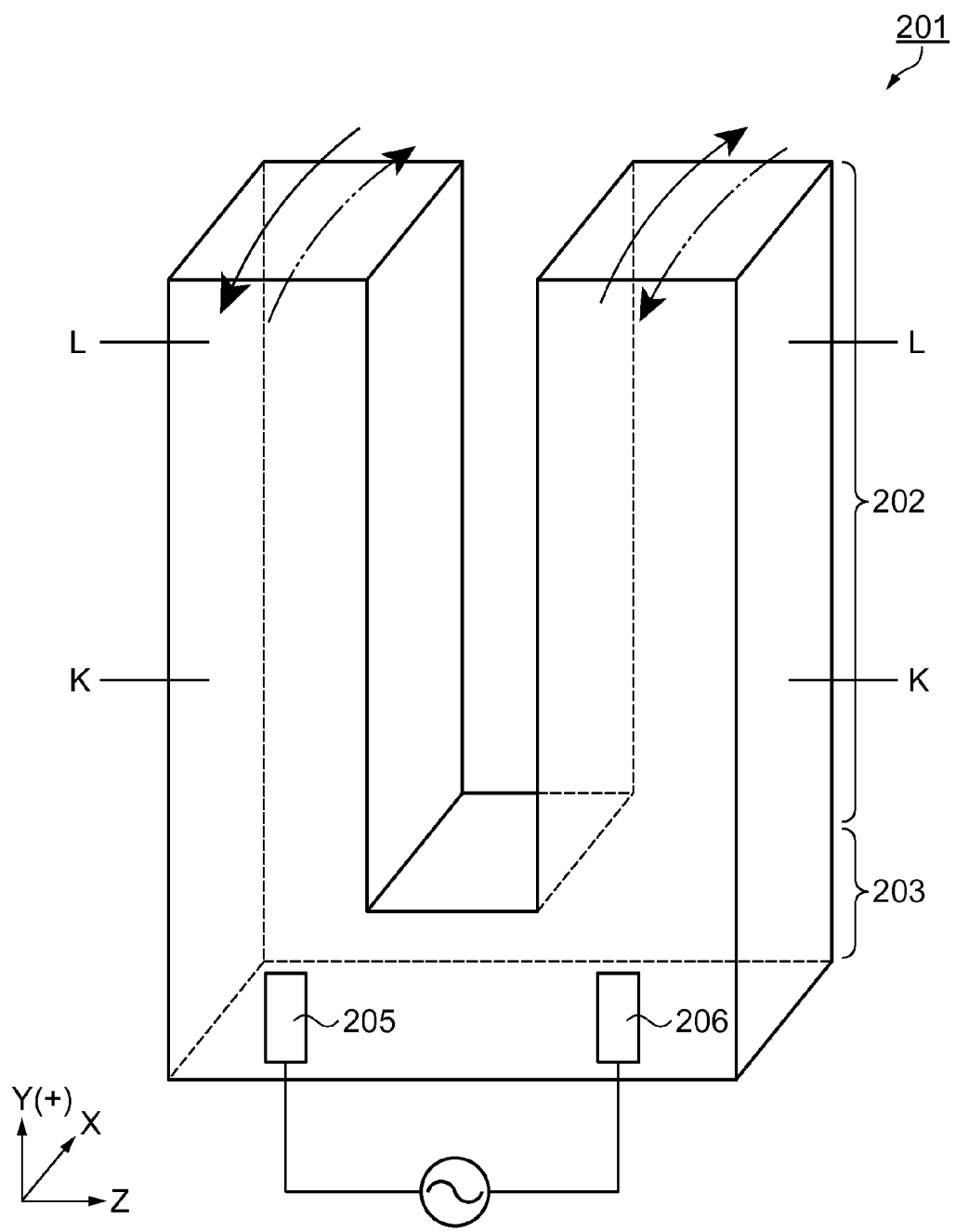
FIG. 6 is a schematic perspective view showing an outline configuration of a crystal vibration piece of a third embodiment.

FIG. 6 is a schematic perspective view showing a crystal vibration piece 201 of the third embodiment. FIG. 7 is a schematic sectional view of a cross-section along the K-K line of FIG. 6 seen from the Y direction. FIG. 8 is a schematic sectional view of a cross-section along the L-L line of FIG. 6 seen from the Y direction. In the embodiment, a depiction of the exciting electrodes is omitted.

The crystal vibration piece 201 shown in FIG. 6, being of the same configuration as the first embodiment shown in FIG. 1, has two vibrating arm portions 202 and a base portion 203, and outputs a signal to the exterior by means of electrode pads 205 and 206. What is different from the first embodiment is that the vibration direction of the vibrating arm portions 202 differs, as shown by the solid arrows and two-dot chain arrows. That is, in the first embodiment, the vibrating arm portions 202 flexurally vibrate in the X axis direction, but in this embodiment, the vibrating arm portions 202 flexurally vibrate in the Z axis direction. For this reason, a description of the configuration and wiring will be omitted, and a description will be given of the point that the vibration direction differs.

Figure 7:
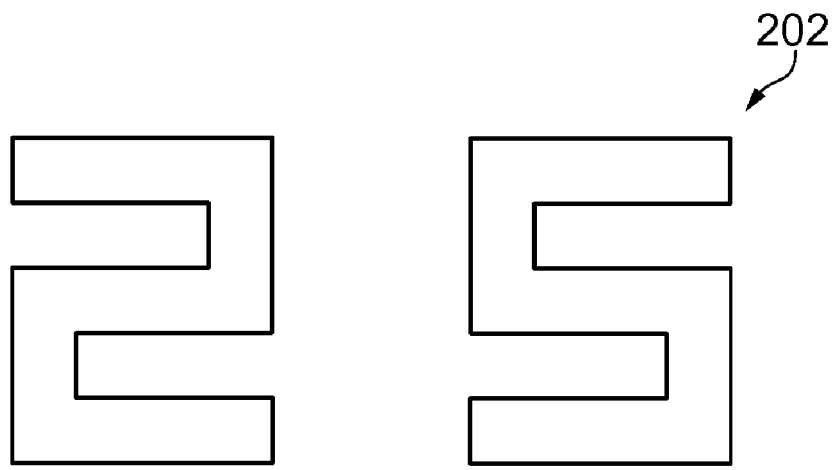
FIG. 7 is a schematic sectional view of FIG. 6.
Figure 8:
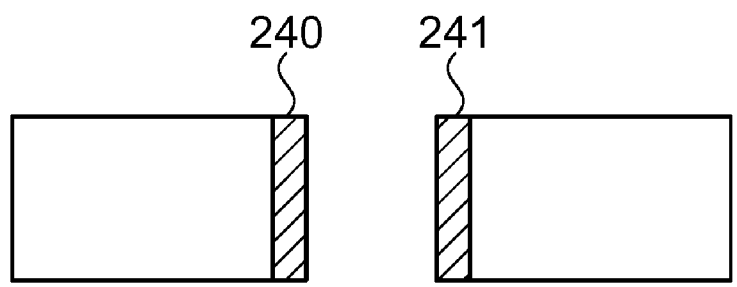
FIG. 8 is a schematic sectional view of FIG. 6.

FIG. 7 being a schematic sectional view of a cross-section along the K-K line of FIG. 6 seen from the Y direction, the sectional views of the vibrating arm portions 20 and 21 of FIG. 2(*a*) are each disposed rotated 90 degrees in a clockwise direction. Also, FIG. 8 being a schematic sectional view of a cross-section along the L-L line of FIG. 6 seen from the Y direction showing formation places of mass portions 240 and 241, in the embodiment, the mass portions 240 and 241 are formed on opposing side surfaces of the two vibrating arm portions 202. In this way, the embodiment is characterized in that a first groove portion and second groove portion are formed in side surfaces of the vibrating arm portions, and the mass portions are formed on side surfaces of the vibrating arm portions.

Consequently, according to the third embodiment, it is possible to obtain the same kind of advantage as in the first and second embodiments.

Figure 9:
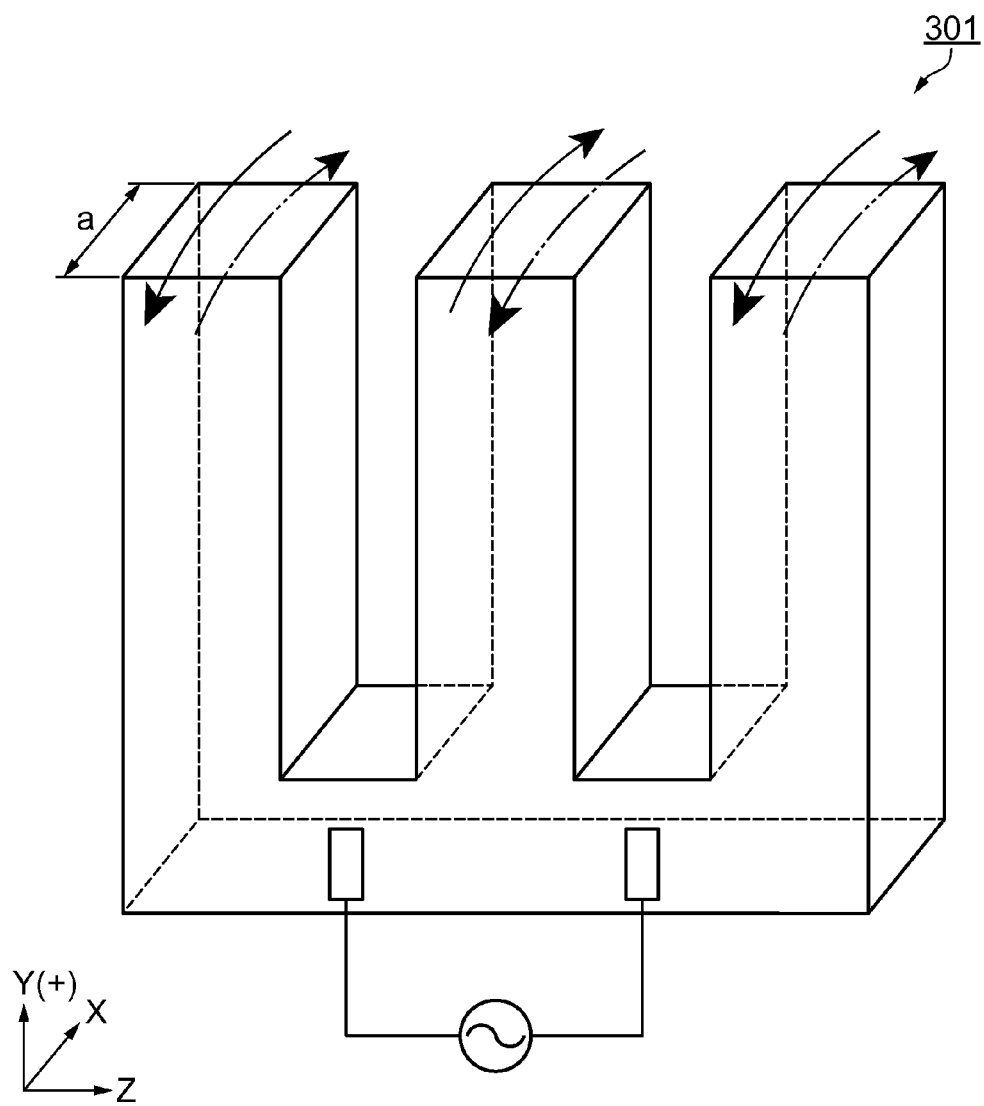
FIG. 9 is a schematic perspective view showing an outline configuration of a crystal vibration piece of another modification example.

In the third embodiment, not being limited to the tuning fork vibrator shown in FIG. 6, a disposition may also be adopted wherein the sectional views of the vibrating arm portions 20 and 121 of FIG. 5(*a*) are each rotated 90 degrees in a clockwise direction. In this case, the mass portions 240 and 241 are formed on the side surfaces opposite the sides of FIG. 8 (the side surfaces which do not oppose each other). Also, although there are two vibrating arm portions in the embodiment, it is also acceptable that there are one or more vibrating arm portions. By having three vibrating arm portions, as in a crystal vibration piece 301 shown in FIG. 9, the vibration balance when flexurally vibrating improves in comparison with the case of having two vibrating arm portions.

(Fourth Embodiment)

Hereafter, a description will be given citing a crystal vibrator as one example of a flexural vibrator of the fourth embodiment.

Figure 10:
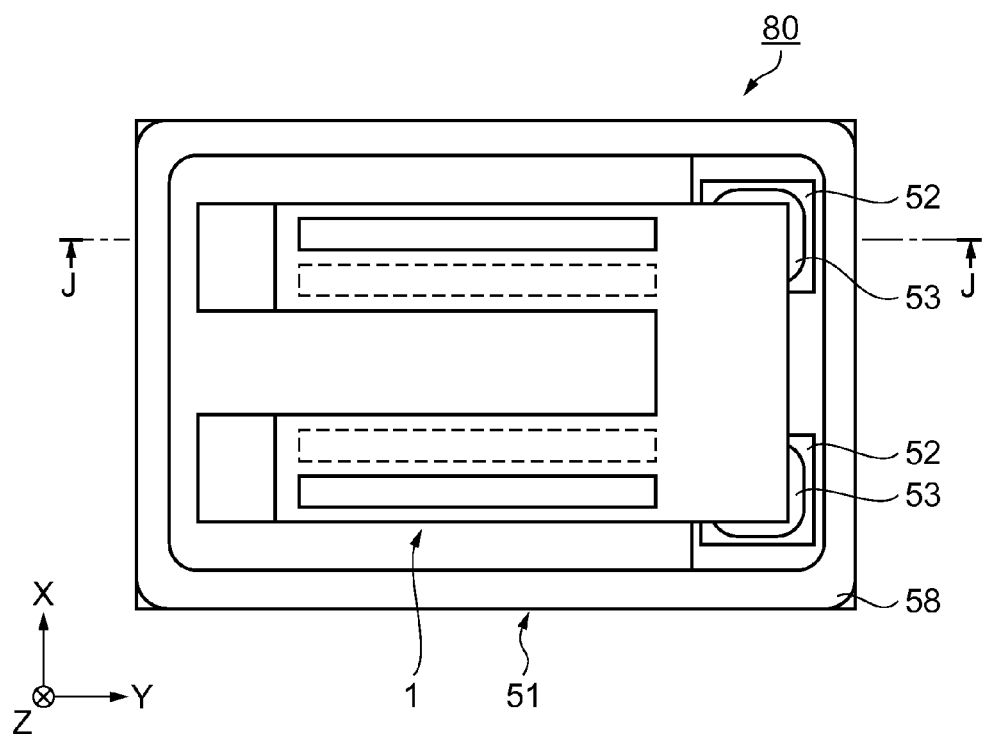
FIG. 10 is a schematic plan view showing an outline configuration of a crystal vibrator of a fourth embodiment.
Figure 11:
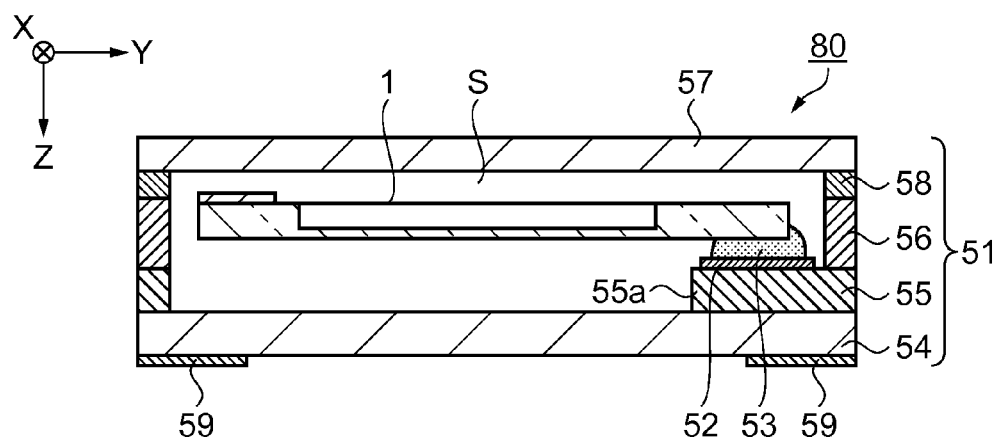
FIG. 11 is a schematic sectional view of FIG. 10.

FIG. 10 is a schematic plan view showing an outline configuration of the crystal vibrator of the fourth embodiment. FIG. 11 is a schematic sectional view along the J-J line of FIG. 10. In FIG. 10, a cover is omitted for descriptive purposes.

Also, the description will be given giving the same reference numerals and signs to portions had in common with the first embodiment.

A crystal vibrator 80 of the fourth embodiment is a crystal vibrator using the crystal vibration piece of the first embodiment or second embodiment. Herein, the description will be given using the crystal vibration piece 1 of the first embodiment.

As shown in FIG. 10 and FIG. 11, the crystal vibrator 80 houses the crystal vibration piece 1 inside a package 51. Specifically, the crystal vibrator 80 houses the crystal vibration piece 1 in an internal space S of the package 51 including a first substrate 54, and a second substrate 55 and third substrate 56 stacked on the first substrate 54, as shown in FIG. 11.

The package 51 includes the first substrate 54, second substrate 55, and third substrate 56, and further includes a cover 57. The package 51 is such that, the second substrate 55 having an extension portion 55*a* extended inside the package 51, two electrode portions 52 are formed on the extension portion 55*a*.

The crystal vibrator 80 is such that, unshown fixed electrodes of the crystal vibration piece 1 being fixed to the electrode portions 52 using a conductive adhesive 53, or the like, the exciting electrodes 30 and 31 (refer to FIG. 2) and electrode portions 52 are electrically connected via the fixed electrodes. As the conductive adhesive 53, it is possible to use one wherein conductive particles such as silver particles are added to a binding component made of a predetermined synthetic resin.

The first substrate 54, second substrate 55, and third substrate 56 are formed of an insulating material, such as a ceramic. In particular, as a preferable material, one is selected which has a linear expansion coefficient the same as, or similar to, the crystal vibration piece 1 and cover 57.

In the embodiment, for example, a ceramic green sheet is used. The green sheet is obtained by, for example, molding a kneaded substance, generated by dispersing ceramic powder in a predetermined solution and adding a binder, into an elongated sheet form, and cutting it into predetermined lengths.

The first substrate 54, second substrate 55, and third substrate 56 can be formed by stacking and sintering the green sheets molded into the forms shown in the drawing. The first substrate 54 configures the bottom portion of the package 51, and the second substrate 55 and third substrate 56 piled thereon, being formed in a frame shape, form the internal space S together with the first substrate 54, cover 57, and the like.

The cover 57 formed of a ceramic, glass, or metal such as kovar is joined to the third substrate 56 across a joining material 58 such as a kovar ring or low-melting point glass. Because of this, the internal space S of the package 51 is hermetically sealed.

After forming an unshown conductive pattern on the first substrate 54 using, for example, a conductive paste of silver, palladium, or the like, or a conductive paste of metalizing tungsten, or the like, the heretofore described electrode portions 52 are formed by sequentially plating with nickel, gold, silver, or the like, after sintering the first substrate 54, second substrate 55, and third substrate 56.

The electrode portions 52 are electrically connected by the unshown conductive pattern to mounting terminals 59 formed on the external bottom surface of the package 51.

The crystal vibrator 80 is such that, by a drive signal being applied to the mounting terminals 59, an alternating charge is applied between the exciting electrodes 30 and 31 of the crystal vibration piece 1 via the unshown fixed electrodes (refer to FIG. 2)

Because of this, the crystal vibration piece 1 carries out the kind of flexural vibration shown in FIG. 1.

As the crystal vibrator 80 is such that the crystal vibration piece 1 is housed in the internal space S of the package 51, and the internal space S of the package 51 is hermetically sealed, as heretofore described, it is possible to provide the crystal vibrator 80 including the crystal vibration piece 1 which achieves the same kind of advantage as the first embodiment.

The crystal vibrator 80 is such that, by using the crystal vibration piece 101 of the second embodiment in place of the crystal vibration piece 1, it is possible to provide the crystal vibrator 80 including the crystal vibration piece 101 which achieves the same kind of advantage as the second embodiment.

The crystal vibrator 80 is such that, by forming the cover 57 in the shape of a cap with a flange, or the like, the second substrate 55 and third substrate 56 may be omitted. By so doing, the components of the crystal vibrator 80 decrease, and the manufacture of the package may become easier.

(Fifth Embodiment)

Hereafter, a description will be given citing a crystal oscillator as one example of an electronic device of the fifth embodiment.

Figure 12:
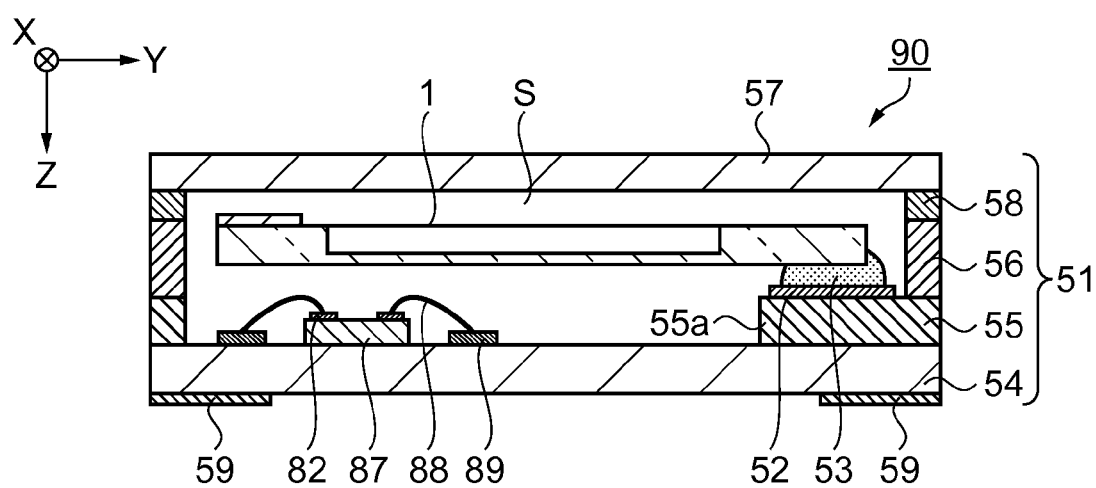
FIG. 12 is a schematic sectional view showing an outline configuration of a crystal oscillator of a fifth embodiment.

FIG. 12 is a schematic sectional view showing an outline configuration of the crystal oscillator of the fifth embodiment.

A crystal oscillator 90 of the fifth embodiment is a crystal oscillator using the crystal vibration piece of the first to third embodiments. Herein, the description will be given using the crystal vibration piece 1 of the first embodiment. Also, the crystal oscillator 90 of the fifth embodiment includes an IC chip 87 as a circuit element causing the crystal vibrator 80 of the fourth embodiment to drive the crystal vibration piece 1.

The same reference numerals and signs will be given to portions had in common with the first embodiment and fourth embodiment, and a description will be omitted.

As shown in FIG. 12, the crystal oscillator 90 is such that internal connection terminals 89 made of gold, or the like, are formed on the upper surface of the first substrate 54 of the package 51.

The IC chip 87, which incorporates an oscillator circuit, is housed in the internal space S of the package 51, and fixed to the upper surface of the first substrate 54 using an adhesive, or the like. Then, IC connection pads 82 made of gold, or the like, are formed on the upper surface of the IC chip 87.

The IC connection pads 82 are connected to the internal connection terminals 89 by metal wires 88.

The internal connection terminals 89 are connected via the unshown conductive pattern to the mounting terminals 59 formed on the external bottom surface of the package 51, and to the electrode portions 52. For the connection of the IC chip 87 and internal connection terminals 89, other than the connection method using the metal wires 88, a connection method using a flip chip mounting, or the like, may be used.

The internal space S of the package 51 is hermetically sealed.

The crystal oscillator 90 is such that an alternating charge is applied between the exciting electrodes 30 and 31 of the crystal vibration piece 1 from the IC chip 87 via the electrode portions 52 and unshown fixed electrodes, in accordance with an input from the exterior (refer to FIG. 2).

Because of this, the crystal vibration piece 1 carries out the kind of flexural vibration shown in FIG. 1. The crystal oscillator 90 outputs an oscillation signal obtained from the flexural vibration to the exterior via the IC chip 87 and mounting terminals 59.

As the crystal oscillator 90 of the fifth embodiment is such that the crystal vibration piece 1 and IC chip 87 are housed in the internal space S of the package 51, and the internal space S of the package 51 is hermetically sealed, as heretofore described, it is possible to provide the crystal oscillator 90 including the crystal vibration piece 1 which achieves the same kind of advantage as the first embodiment.

The crystal oscillator 90 is such that, by using the crystal vibration piece 101 of the second embodiment in place of the crystal vibration piece 1, it is possible to provide the crystal oscillator 90 including the crystal vibration piece 101 which achieves the same kind of advantage as the second embodiment.

In the fifth embodiment, a description is given citing a crystal oscillator as one example of an electronic device but, not being limited to this, for example, a pressure sensor, gyro sensor, or the like, including a detector circuit or the like in the IC chip 87 is also acceptable.

As the material of the flexural vibration piece, it not being limited to a crystal, a piezoelectric body such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or a semiconductor such as silicon, is also acceptable.

What is claimed is:

1. A flexural vibration piece, comprising:
    a base portion; and
    a vibrating arm portion that extends in a first direction from the base portion and that flexurally vibrates,
    wherein the vibrating arm portion includes:
        a first main surface and a second main surface opposite to each other;
        a first groove portion formed in the first direction in the first main surface; and
        a second groove portion formed in the first direction in the second main surface, and wherein the first groove portion and second groove portion are positioned side by side in a second direction perpendicular to the first direction in plan view from a normal direction of the first main surface, each of a first depth of the first groove portion and a second depth of the second groove portion are smaller than a thickness of the vibrating arm in the normal direction between the first main surface and second main surface, and the sum of the first depth and second depth is greater than the thickness, and a mass portion is provided on at least one of the first main surface and the second main surface.

2. The flexural vibration piece according to claim 1, wherein the vibrating arm portion has a third main surface and a fourth main surface that connect the first main surface and second main surface, and the third main surface and the fourth main surface are opposite to each other, and when the third main surface is stretched, the fourth main surface is compressed, and when the third main surface is compressed, the fourth main surface is stretched.

3. The flexural vibration piece according to claim 1, wherein, taking a flexural vibration frequency of the vibrating arm portion as f, a circumference ratio as $\pi$, a heat conductivity in a vibration direction of a material used for the vibrating arm portion as k, a mass density of the material used for the vibrating arm portion as $\rho$, a heat capacity of the material used for the vibrating arm portion as $C_p$, and a width in the vibration direction of the vibrating arm portion as a, when $fm = \pi k/(2\rho C_p a^2)$, $0.09 < f/fm$.

4. The flexural vibration piece according to claim 1, wherein the vibrating arm portion includes a first vibrating arm portion and a second vibrating arm portion extending side by side to each other from the base portion, and each of the first vibrating arm portion and the second vibrating arm portion includes the first and second main surfaces and the first and second groove portions.

5. The flexural vibration piece according to claim 4, wherein a first positioning direction of the first groove portion and second groove portion of the first vibrating arm portion, and a second positioning direction of the first groove portion and second groove portion of the second vibrating arm portion, are the reverse of each other.

6. The flexural vibration piece according to claim 5, wherein the mass portion of the first vibrating arm portion and the mass portion of the second vibrating arm portion are both formed on a side of either the first main surface or the second main surface.

7. The flexural vibration piece according to claim 4, wherein a first positioning direction of the first groove portion and second groove portion of the first vibrating arm portion, and a second positioning direction of the first groove portion and second groove portion of the second vibrating arm portion, are the same as each other.

8. The flexural vibration piece according to claim 7, wherein the mass portion of the first vibrating arm portion is provided on the first main surface, and the mass portion of the second vibrating portion is provided on the second main surface.

9. The flexural vibration piece according to claim 1, wherein the mass portion is provided in at least the vicinity of a tip portion of the vibrating arm portion.

10. The flexural vibration piece according to claim 1, wherein the mass portion is formed using a metal layer.

11. The flexural vibration piece according to claim 1, wherein the base portion and vibrating arm portion are formed using a crystal.

12. A flexural vibrator using the flexural vibration piece according to claim 1, comprising:
the flexural vibration piece; and
a package housing the flexural vibration piece, wherein
the flexural vibration piece is housed in an internal space of the package, and the internal space of the package is hermetically sealed.

13. An electronic device using the flexural vibration piece according to claim 1, comprising:
the flexural vibration piece;
a circuit element that causes the flexural vibration piece to be driven; and
a package housing at least the flexural vibration piece, wherein
the flexural vibration piece is housed in an internal space of the package, and the internal space of the package is hermetically sealed.

* * * * *